United States Patent [19]

Counts et al.

[11] Patent Number: 4,639,683

[45] Date of Patent: Jan. 27, 1987

[54] VERY LOW INPUT CURRENT JFET AMPLIFIER

[75] Inventors: Lewis W. Counts, Lexington; JoAnn P. Close, Arlington, both of Mass.

[73] Assignee: Analog Devices, Incorporated, Norwood, Mass.

[21] Appl. No.: 827,236

[22] Filed: Feb. 7, 1986

[51] Int. Cl.⁴ .............................................. H03F 3/45
[52] U.S. Cl. .................................... 330/253; 330/257; 330/261; 330/311
[58] Field of Search ............... 330/253, 257, 261, 277, 330/311; 357/22 R, 22 G

[56] References Cited

PUBLICATIONS

Fullagar, "Better Understanding of FET Operation Yields Viable Monolithic J-FET OP AMP", *Electronics*, Nov. 6, 1972, pp. 98–101.

*Primary Examiner*—James B. Mullins
*Attorney, Agent, or Firm*—Parmelee, Bollinger & Bramblett

[57] ABSTRACT

A monolithic IC chip having a differential amplifier comprising a pair of JFETs with their top and back gates electrically isolated to provide a low-leakage-current input to the top gates. The amplifier includes independent bias circuitry for setting the potentials of the JFET back gates to a level close to that of the top gates. This circuitry includes resistive means coupled to the source electrodes of the input JFETs, and operable to establish a low-noise bias point for the back gates. The bias circuitry includes a reference current source comprising a pair of JFETs identical to the input JFETs and arranged to provide a gate-to-source voltage to match that of the input JFETs.

21 Claims, 1 Drawing Figure

U.S. Patent
Jan. 27, 1987
4,639,683
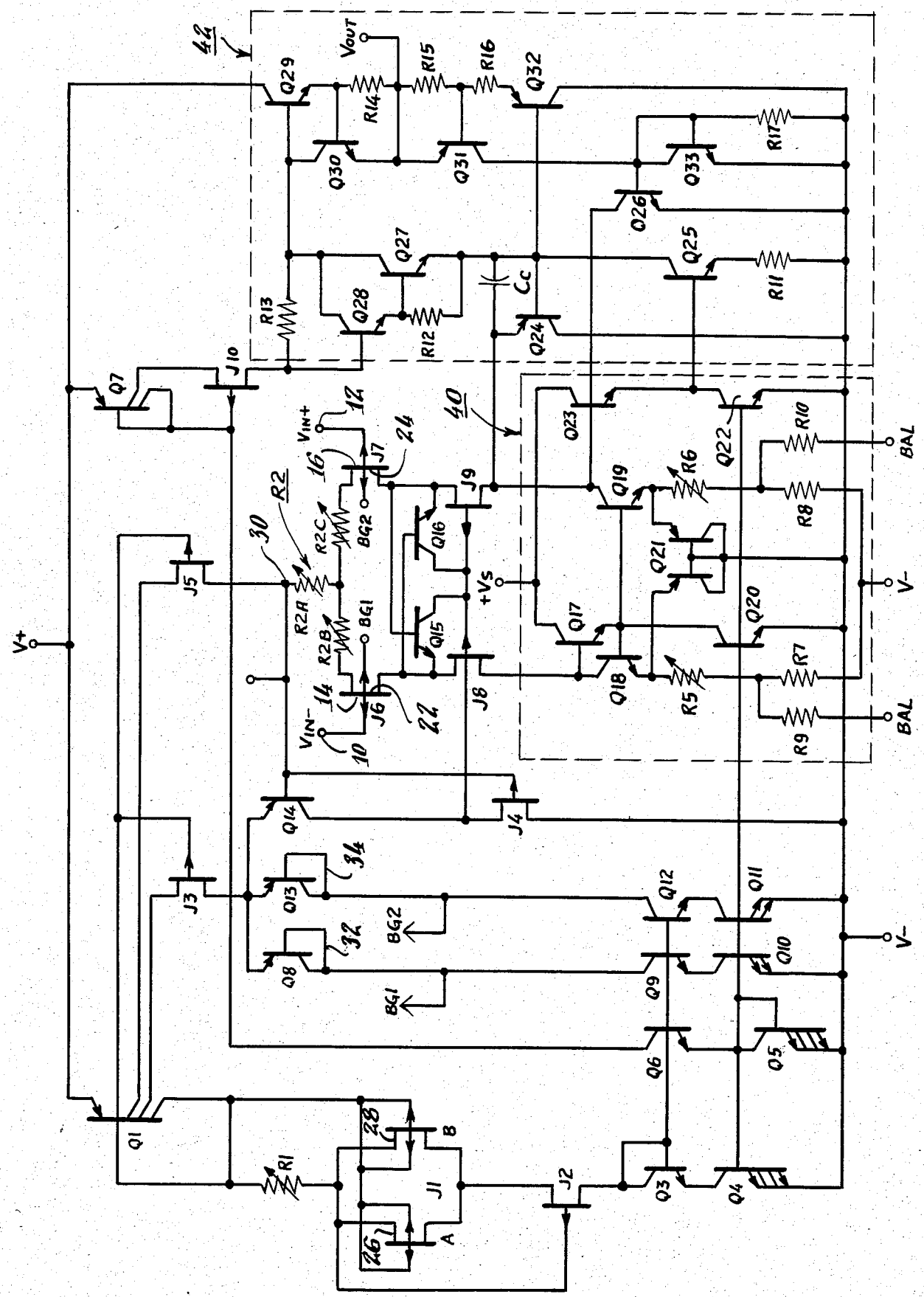

VERY LOW INPUT CURRENT JFET AMPLIFIER

BACKGROUND OF THE INVENTION

1. Field of the Invention

This invention relates to IC amplifiers for low-input current applications. More particularly, this invention relates to such amplifiers employing low-leakage-current Junction Field Effect Transistors (JFETs) having electrically-isolated top and back gates.

2. Description of the Prior Art

Monolithic amplifiers for low input current applications generally have used MOSFET or JFET input stages. MOSFET devices have very low leakage, but have disadvantages. For example, they require overvoltage protection diodes which can increase the net input current to 1 pA or more. Also, the low-frequency voltage resolution of MOSFET inputs is limited by high 1/f noise due to surface effects on the MOSFET channel.

Ion-implanted JFETs are available with an n+ shield connected to the pocket n-epitaxy of the device to form a gate on each side of the p+ implanted channel. This greatly reduces voltage noise compared to MOSFETs. However, leakage current from the back gate to the substrate and the isolation junctions raises the input current substantially, e.g. to 2 pA. Dielectric isolation has been used to eliminate back gate to substrate leakage, making possible amplifiers with gate currents of 1 pA.

Recently, JFETs have been developed with electrically-isolated top and back gates. One particularly advantageous arrangement of that kind is described in U.S. patent application Ser. No. 658,270 (J. F. Lapham et al.), filed on Oct. 5, 1984. The JFET shown there avoids the usual conductive connection between the top and back gates by the use of closed geometry for the source/drain regions. That is, one source/drain region fully surrounds (in a lateral sense) the other source/drain region. A non-penetrating contact layer is provided on the upper surfaces of the top gate, to prevent the material of the contact layer from entering the top gate region to any significant extent, thereby avoiding possible conductive connection through to the back gate by that route. With the top and back gates thus isolated electrically, the JFET becomes a four-terminal device, with independent access available to all four terminals.

Although such JFETs have extremely low leakage current into their top gates, e.g. 50 fempto-amps, there has been a problem in providing suitable amplifier circuitry which is capable of taking full advantage of the special low-leakage-current chracteristics of four-terminal JFETs.

SUMMARY OF THE INVENTION

In a preferred embodiment of the present invention, to be described hereinbelow in detail, there is provided a monolithic differential amplifier having an input circuit comprising a pair of low-leakage-current JFETs with their top and back gates electrically isolated in the transistor structure. The two input terminals of the amplifier are connected respectively to the top gates of these JFETs. The potential of the back gates is set by circuitry separate from the input circuit, and arranged so as to provide a low noise bias potential for the back gates.

In one particularly preferred embodiment, the back gate potentials of the input circuit JFETs are controlled by circuitry including a reference pair of JFETs which are structurally matched to the first pair, but which have their top and back gates connected together. The current through this reference pair of JFETs is mirrored to the current through the input circuit pair of JFETs, and that current in turn is converted to a bias potential by an electrical resistance in series with the source electrodes of the input circuit pair. This bias potential is coupled through buffer means to produce bias voltages for the respective back gates of the input JFETs.

Accordingly, it is an object of this invention to provide an amplifier circuit which can be manufactured with conventional IC processes of the junction-isolation type, and which is suitable for use with low-leakage-current JFETs having electrically-isolated top and back gates. Other objects, aspects and advantages of the invention will in part be pointed out in, and in part apparent from, the following description of a preferred embodiment of the invention, considered together with the accompanying drawing.

BRIEF DESCRIPTION OF THE DRAWINGS

The single FIGURE of drawings is a circuit diagram of a differential amplifier incorporating the present invention.

DETAILED DESCRIPTION OF A PREFERRED EMBODIMENT

Referring now to the drawing, there is shown the circuit of an amplifier formed on a monolithic IC chip and comprising a pair of input terminals 10, 12 (see the upper central portion of the FIGURE) for receiving a differential input signal Vin to be amplified. These terminals are connected respectively to the top gates 14, 16 of a pair of low-leakage-current JFETs generally indicated at J6, J7.

The back gates 22, 24 of these JFETs are conductively isolated from the top gates. This isolation is achieved, for example, by employing a transistor structure as disclosed in the above-identified patent application Ser. No. 658,270. Such a device thus affords independent access to all four terminals of the JFET. With that type of construction, the leakage current normally contributed to the input circuit by the back gates is essentially eliminated, leaving only the top gate leakage current which is extremely low.

The potentials of the back gates 22, 24 must however be properly controlled to achieve satisfactory amplifier operation. Such control is effected in the present invention by bias circuitry, now to be described, which refers the back gates to a bias point related to the potential of the top gates. This bias point preferably is a low noise point, because transconductance of the JFETs is almost equally divided between the top and back gates, so that it is important to minimize input noise to the back gates.

Referring now to the left-hand side of the circuit diagram, there is shown a second pair of JFETs J1A, J1B which are matched to the input JFETs J6, J7, and act as reference JFETs for the input JFETs. Specifically, in the preferred embodiment, the second pair of JFETs individually are identical structurally and geometrically to the input JFETs. However, the top and back gates of the second pair of JFETs are all connected in common, so that these gates all are fixed at the same potential. This forces an equal gate-to-source voltage (VGS1) for the top gate and back gate junctions.

A resistor R1 is connected to the source electrodes 26, 28 of the second pair of JFETs J1A,B and converts the gate-to-source voltage VGS1 to a reference current; that is, the reference JFETs are arranged to serve as a current source. The current of this source flows through a current mirror including a transistor Q1 having its emitter connected to the positive supply voltage V+. This current mirror fixes the operating current flowing down to the source electrodes of the input JFETs J6, J7, maintaining the operating current equal to the reference current.

This operating current flows through a conventional constant-current cascoded JFET J5 and a bias resistor R2 (including a resistor R2A common to both input JFETs, and a pair of trim resistors R2B, R2C to be described below) which during manufacture is matched to R1. Because R1 and R2 are matched, the current-mirrored input JFET operating current (in its quiescent, static state) reproduces VGS1 across R2, i.e. between the upper terminal 30 of resistor R2 and the source electrodes of the input JFETs.

Since J1A, J1B and J6, J7 are identical, and operate at identical current densities, their gate-to-source voltages will necessarily track with changes in conditions of the IC chip such as temperature or aging. Thus the voltage developed across the bias resistor R2 will be equal to the gate-to-source voltage of the input JFETs J6, J7. The potential at the upper end 30 of resistor R2 is established as a bias potential. This bias potential is directed to the base of a transistor Q14.

Transistor Q14 forms part of a buffer circuit including two other transistors Q8, Q13, with the latter being diode-connected (common base/collectors). The emitters of all three transistors are connected together. Thus, the bias potential at terminal 30 is reproduced at the base/collector electrodes 32, 34 of the transistors Q8, Q13. These electrodes in turn are connected to the respective back gate terminals BG1, BG2 of the two input JFETs J6, J7. This circuitry provides that the potentials on the back gates will (statically) equal that on the top gates within 10 millivolts.

The bias potential applied to the back gates 22, 24 is a low-noise potential in part because it is derived from a common-mode signal level, i.e. the source electrodes of the input JFETs. In addition, the buffer circuitry coupling this signal level to the back gates includes diodes Q8, Q13 which are operated at relatively high current levels to assure low noise content.

The diodes Q8, Q13 provide effective conductive isolation between the two back gates, preventing current flow between the top gates, i.e. through the JFETs and between the two back gates, which otherwise could flow due to the parasitic bipolar NPN transistor junctions inherently part of each JFET structure. It is important that these diodes be high-level devices, capable of withstanding the maximum expected overload, e.g. twenty volts.

Although a relatively low range of back-gate-to-top-gate voltage variations (±10 mV) is particularly advantageous, and provides a comfortable safety margin for good performance, it has been found that for some applications satisfactory amplifier operation with low leakage can be achieved while holding the back gate potential to within 100 mv of the top gate voltage.

In accordance with a further aspect of the present invention, a set of current sources Q9, Q10 and Q11, Q12 is connected to the base/collectors 32, 34 of the buffer diodes Q8, Q13 to receive the diode currents, and to stabilize the current flow in those paths. The currents are derived from the current mirror transistor Q1, and flows through a constant-current cascoded standard JFET J3.

These current sources Q9, Q10 and Q11, Q12 particularly are advantageous because they limit the flow of current through the input device gates during large signal transients. Such limitation is especially important because, under certain conditions, current could flow between the top and back gates, i.e. through the parasitic NPN transistor junctions inherently part of the JFET structure. If the top gate is biased one VBE more negative than the source, the back gate will inject minority carriers into the channel. Such current flow is minimized by the current sources connected to the back gates.

The reference resistor R1 is trimmed during manufacture of the amplifier to provide that the reference JFETs J1A,B operate at their zero temperature-coefficient (zero-TC) current. In the preferred embodiment, this current was 60 µA. The bias resistor R2 (comprising R2A, B, and C) is adjusted during manufacture to equal R1. The adjustment is made by measuring the potential at resistor terminal 30, and adjusting R2A until that potential is equal to the top gate potential (i.e. the "ground" reference potential) for the input JFETs. With the reference JFETs J1A,B operating at their zero-TC current, and with the overall resistance value R2 trimmed to equal that of R1, the temperature coefficient of the operating current to the input stage will be quite low, e.g. within ±200 ppm.

Offset voltage at a particular temperature (e.g. 25° C.) is nulled by trimming resistors R2B and R2C. This adjustment is sufficiently minor that it does not affect significantly the equality of R1 and R2 nor the bias voltages applied to the back gates 22, 24.

The input JFETs J6, J7 are cascoded by standard JFETs J8 and J9 to further minimize input leakage and to improve the common mode rejection ratio (CMRR). Another standard JFET J4, connected as a source follower, is cascode-coupled to the buffer transistor Q14, providing buffering of Q14. The source of J4 drives the two cascode-coupled JFETs J8, J9.

An active load circuit 40 is coupled to the JFETs J8, J9, and serves to convert the amplifier signal from balanced to single-ended format. This active load circuit comprises a current mirror, including Q17, Q18 and Q19, which is heavily degenerated to minimize its contribution to input offset and noise voltages. Offset voltage drift is minimized by adjustment of resistors R5, R6. The single-ended output signal of the differential stage appears at the drain of JFET J9. The gain of this differential stage in the preferred embodiment was about 500.

The single-ended output signal from the differential stage is coupled to an output stage generally indicated at 42, with a gain of about 1,000, and thus providing an overall gain of about $5 \times 10^5$ for the amplifier. The output stage includes an integrating capacitor $C_c$ to provide frequency compensation. The output terminal $V_{OUT}$ is connected between a pair of output transistors Q29, Q32, with transistors Q26, Q31 and Q33 providing protection against short-circuits, and transistors Q27, Q28 furnishing bias for the output stage. Still other transistors and current sources are provided in accordance with known techniques.

Although a specific preferred embodiment of the invention has been described herein in detail, it is desired to emphasize that this is for the purpose of illustrating the invention, and should not necessarily be construed as limitative of the invention since it is apparent that those skilled in the art can make many modified arrangements of the invention without departing from the true scope thereof.

What is claimed is:

1. An IC chip including a low-input-current differential amplifier comprising:
   a pair of low-leakage-current JFETs having their top and back gates electrically isolated in the transistor structures;
   a pair of input terminals connected respectively to the top gates of said JFETs to supply thereto a differential input signal to be amplified;
   a supply voltage circuit having first and second terminals;
   first circuit means connecting said first supply voltage terminal to the source electrodes of said JFETs to furnish operating current thereto;
   second circuit means connecting said second supply voltage terminal to the drain electrodes of said JFETs;
   bias means connected to said source electrodes and including a bias terminal establishing a predetermined bias potential with respect to said source electrodes; and
   third circuit means coupling said bias terminal to the back gates of said JFETs.

2. Apparatus as claimed in claim 1, wherein said third circuit means maintains said back gates at a potential within 100 mV of said top gates.

3. Apparatus as claimed in claim 1, wherein said bias means comprises a first resistor in series with the flow of operating current to said source electrodes.

4. Apparatus as claimed in claim 3, including a current source;
   said first circuit means comprising current mirror means coupled to said current source and operable to maintain said operating current at a level corresponding to the current of said current source.

5. Apparatus as claimed in claim 4, wherein said current source comprises JFET means matched to said pair of low-leakage-current JFETs;
   the operating current of said JFET means serving as the controlled current of said source.

6. Apparatus as claimed in claim 5, wherein said JFET means comprises a second pair of JFETs matched to said first pair and having their top and back gates connected together.

7. Apparatus as claimed in claim 6, including a second resistor connected in series with the operating current of said second pair of JFETs;
   said first and second resistors being matched;
   said current mirror forcing said operating current of said pair of low-leakage-current JFETs to 1:1 the operating current of said second pair of JFETs.

8. Apparatus as claimed in claim 7, wherein said operating current of said second pair of JFETs is set at the zero-TC value, whereby the operating current of said pair of low-leakage-current JFETs similarly will be at its zero-TC value.

9. Apparatus as claimed in claim 1, wherein said bias means includes a resistor through which current flows to the source electrodes; the remote end of said resistor serving as said bias terminal.

10. Apparatus as claimed in claim 1, wherein said third circuit means comprises buffer means.

11. Apparatus as claimed in claim 10, wherein said buffer means comprises first and second means to supply separate bias potentials to said two back gates respectively.

12. Apparatus as claimed in claim 11, wherein said buffer means comprises three transistors having their emitters connected together;
   the base of one of said transistors being connected to said bias terminal;
   the other two transistors being connected as diodes; and
   means connecting the base/collectors of said diodes respectively to said back gates.

13. Apparatus as claimed in claim 1, including a second pair of JFETs coupled in cascode with said pair of low-leakage-current JFETs to minimize input leakage and improve CMRR.

14. Apparatus as claimed in claim 1, wherein said first circuit means comprises first and second adjustable trim resistors respectively connected in series with the operating currents to each of said source electrodes.

15. An IC chip including a low-input-current differential amplifier comprising:
   a pair of low leakage-current JFETs having their top and back gates electrically isolated in the transistor structures;
   a pair of input terminals connected respectively to the top gates of said JFETs to supply thereto a differential input signal to be amplified;
   a supply voltage circuit having first and second terminals;
   first circuit means connecting said first supply voltage terminal to the source electrodes of said JFETs to furnish operating current thereto;
   second circuit means connecting said second supply voltage terminal to the drain electrodes of said JFETs;
   bias means establishing a predetermined bias potential;
   third circuit means coupling said bias potential to the back gates of said JFETs; and
   current source means coupled to said back gates to prevent transient current flows therethrough.

16. Apparatus as claimed in claim 15, wherein said third circuit means comprises first and second means establishing separate bias potentials for said back gates respectively.

17. Apparatus as claimed in claim 16, wherein said first and second means comprise diode means to conductively isolate said back gates.

18. Apparatus as claimed in claim 17, wherein said diode means comprise first and second diodes with one electrode of each connected together and the other electrodes thereof connected respectively to said back gates.

19. An IC chip including a low-input-current differential amplifier comprising:
   a pair of low-leakage-current JFETs having their top and back gates electrically isolated in the transistor structures;
   a pair of input terminals connected respectively to the top gates of said JFETs to supply thereto a differential input signal to be amplified;

a supply voltage circuit having first and second terminals;

first circuit means connecting said first supply voltage terminal to the source electrodes of said JFETs to furnish operating current thereto;

second circuit means connecting said second supply voltage terminal to the drain electrodes of said JFETs;

bias means establishing first and second bias potentials and coupling said bias potentials respectively to the back gates of said JFETs;

said bias means comprising isolation means preventing excessive current flow between said back gates.

20. Apparatus as claimed in claim 19, wherein said isolation means comprises a pair of diodes having one common electrode of each connected together;

the other electrodes of said diodes being coupled respectively to said back gates to supply thereto the required bias potential.

21. Apparatus as claimed in claim 20, wherein said common electrode is the emitter diode;

said other electrodes comprising the base/collector electrodes.

* * * * *